United States Patent
Solomentsev et al.

(10) Patent No.: US 6,967,158 B2
(45) Date of Patent: Nov. 22, 2005

(54) METHOD FOR FORMING A LOW-K DIELECTRIC STRUCTURE ON A SUBSTRATE

(75) Inventors: Yuri Solomentsev, Allen, TX (US); Matthew S. Angyal, Stormville, NY (US); Errol Todd Ryan, Austin, TX (US); Susan Gee-Young Kim, Evanston, IL (US)

(73) Assignees: Freescale Semiconductor, Inc., Austin, TX (US); Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/384,398

(22) Filed: Mar. 7, 2003

(65) Prior Publication Data

US 2004/0175922 A1 Sep. 9, 2004

(51) Int. Cl.[7] ......................................... H01L 21/4763
(52) U.S. Cl. ...................... 438/634; 438/631; 438/633; 438/637
(58) Field of Search ................................. 438/624, 631, 438/633, 634, 637

(56) References Cited

U.S. PATENT DOCUMENTS

| | | | |
|---|---|---|---|
| 6,235,608 B1 * | 5/2001 | Lin et al. ...................... 438/424 |
| 6,319,850 B1 | 11/2001 | Chang et al. | |
| 6,380,078 B1 | 4/2002 | Liu et al. | |
| 6,440,840 B1 | 8/2002 | Chen | |
| 6,468,851 B1 | 10/2002 | Ang et al. | |
| 6,475,929 B1 | 11/2002 | Gabriel et al. | |
| 6,486,059 B2 | 11/2002 | Lee et al. | |
| 6,531,412 B2 | 3/2003 | Conti et al. | |
| 6,656,842 B2 * | 12/2003 | Li et al. ...................... 438/691 |
| 6,657,304 B1 * | 12/2003 | Woo et al. ................... 257/758 |
| 6,670,022 B1 * | 12/2003 | Wallace et al. ............. 428/156 |
| 2001/0013507 A1 * | 8/2001 | Hosali et al. .................. 216/89 |
| 2002/0177329 A1 * | 11/2002 | Yang et al. .................. 438/798 |
| 2003/0001273 A1 * | 1/2003 | Steiner et al. ............... 257/760 |
| 2003/0024902 A1 * | 2/2003 | Li et al. ......................... 216/67 |
| 2003/0155657 A1 * | 8/2003 | Tonegawa et al. .......... 257/774 |
| 2004/0018748 A1 * | 1/2004 | Lu et al. ..................... 438/778 |

OTHER PUBLICATIONS

Wolf, Silicon Processing for the VLSI Era, vol. 1 Process Technology, (Lattice Press, California, 1986), p. 192.*

* cited by examiner

Primary Examiner—Christian Wilson

(57) ABSTRACT

The present invention provides a method for forming a low-k dielectric structure on a substrate 10 that includes depositing, upon the substrate, a dielectric layer 12. A multi-film cap layer 18 is deposited upon the dielectric layer. The multi-film cap layer includes first 181 and second 182 films, with the second film being disposed between the dielectric layer and the first film. The first film typically has a removal rate associated therewith that is less than the removal rate associated with the second film. A deposition layer 20 is deposited upon the multi-film cap layer and subsequently removed. The properties of the multi-film cap layer are selected so as to prevent the dielectric layer from being exposed/removed during removal of the deposition film. In this manner, a deposition layer, having variable rates of removal, such as copper, may be planarized without damaging the underlying dielectric layer.

19 Claims, 2 Drawing Sheets

METHOD FOR FORMING A LOW-K DIELECTRIC STRUCTURE ON A SUBSTRATE

BACKGROUND OF THE INVENTION

The field of invention relates generally to the fabrication of integrated circuits. More particularly, the invention relates to a method for forming a low-k dielectric structure on a substrate.

The fabrication of modern semiconductor devices includes forming multiple layers of conductive and dielectric materials on substrates. Formation of these layers occurs through various processes, chemical vapor deposition (CVD), plasma enhanced CVD (PECVD), atomic layer deposition (ALD), physical vapor deposition (PVD) and the like.

The semiconductor industry strives to increase the number of semiconductor devices formed per unit area on the substrate. As a result, the feature size of the semiconductor devices continues to decrease. This has resulted in a doubling of the number of semiconductor devices present in a unit area every two years, referred to as Moore's Law.

As the feature sizes associated with semiconductor devices decrease, the deleterious effects of the electrical characteristics of the materials from which the conductive and dielectric layers are formed increase. For example, the Resistance-Capacitance (RC) delay introduced by the aforementioned materials limits the operational speed of the semiconductor devices. As a result, there have been many attempts of alleviating RC delays in semiconductor devices.

Conventionally, RC delays are alleviated by employing materials having low dielectric constants, k. Many of the low dielectric materials, however, have properties that are incompatible with other materials employed to fabricate semiconductor devices or are incompatible with processes employed to fabricate the semiconductor devices. For example, adhesion to layers formed from a low dielectric constant material by adjacent layers is often poor, resulting in delamination. Additionally, layers formed from low dielectric materials are often structurally compromised by Chemical Mechanical Polishing (CMP) processes through erosion, as well as adsorption of CMP slurry chemicals. Etching processes often produce micro-trenches and rough surfaces in layers formed from materials having low dielectric constants, which is often unsuitable for subsequent photolithography processes. As a result, these materials are problematic to integrate into damascene fabrication processes.

Therefore, a need exists to provide improved techniques for producing semiconductor structures having layers formed from materials having low dielectric constants.

DETAILED DESCRIPTION OF THE INVENTION

Figure 1:
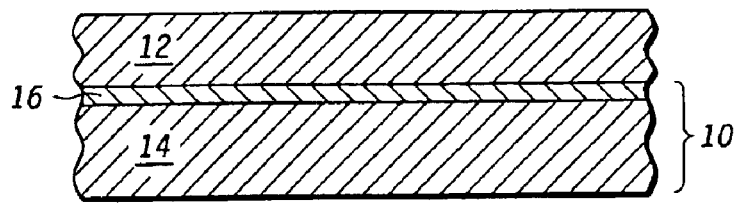
FIG. 1 is a cross-sectional view illustrating a low-k dielectric layer disposed upon a substrate including a silicon nitride film in accordance with the present invention.

Referring to FIG. 1, a portion of a substrate 10 is shown having dielectric layer 12 disposed thereon. The dielectric constant associated with layer 12 is typically less than about 4.0, defining a low-k dielectric constant, with a preferred range of 1.5 to 3.0. Substrate 10 typically includes a wafer 14 that may be formed from any known material, such as silicon, and may include any number of layers, e.g., such as interconnect wiring layers or contacts to active and passive components. In the present example, substrate 10 includes wafer 14 having a passivation layer 16 formed from silicon nitride, SiN. Passivation layer 16 may be any desired thickness, e.g., in a range of approximately 100 to 2,000 angstroms or greater.

Low-k dielectric layer 12 may be formed from any known dielectric material having suitable dielectric properties, depending upon the application. Low-k dielectric layer 12 may be any desired thickness, e.g., in a range of 300 to 5,000 angstroms or more, but may be thinner to minimize capacitance. In the present example, low-k dielectric layer 12 is formed from an organosilicate glass (OSG) having a composition of $Si_WC_XO_YH_Z$ and a thickness in a range of 1,000 to 5,000 angstroms. Low-k dielectric layer 12 may be deposited using known techniques, such as CVD, PECVD and the like.

Figure 2:
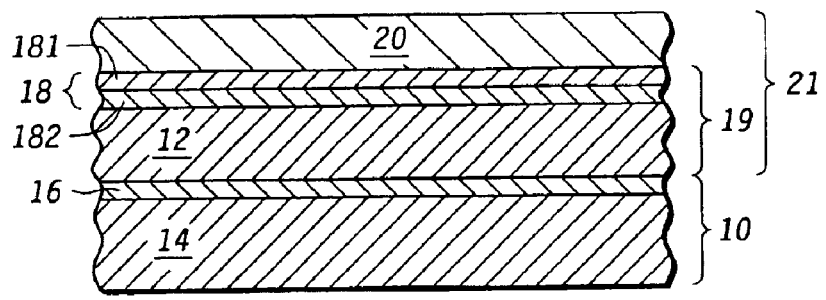
FIG. 2 is a cross-sectional view illustrating a multi-film cap layer disposed upon the low-k dielectric film in accordance with the present invention.

Referring to FIG. 2, formed adjacent to low-k dielectric layer 12 is a multi-film cap layer 18 to form a film stack 19. Multi-film cap layer 18 includes a first film 181 and a second film 182, with the second film 182 being disposed between dielectric layer 12 and first film 181. Deposited adjacent to multi-film cap layer 18 is a deposition layer 20. Deposition layer 20, multi-film cap layer 18 and dielectric layer 12 define a film stack 21.

Second film 182 may be formed from any nonporous low-k material suitable to function as a conventional cap layer, i.e., second film 182 should maintain electrical integrity when subjected to etching and chemical mechanical polishing (CMP) processes. An exemplary material from which second film 182 may be formed includes densified organosilicate glass (OSG). Although second film 182 may have any suitable thickness, in the present example second film 182 has a thickness in a range of 100 to 1,000 angstroms.

First film 181, however, need not be formed from low-k material, because first film 181 is a sacrificial layer. The material from which first film 181 is formed is selected so that the combined film properties, e.g. removal rate and film thickness, of film stack 21 prevent dielectric layer 12 from being removed during removal of deposition layer 20, such as occurs during planarization processes. The characteristics of first film 181 are, therefore, dependent upon the removal technique employed to remove/planarize deposition layer 20, the characteristics of deposition layer 20, e.g., removal rate and uniformity of the removal rate over an area thereof, as well as the characteristics of underlying second film 182. Further, the sacrificial nature of first film 181 enables the material selected to fabricate the same to be independent of the dielectric constant thereof.

In the present example, deposition layer 20 is formed from a conductive material such as copper (Cu). First film 181 is formed from materials that have a removal rate that is slower than the removal rate associated with deposition layer 20. The removal rate of first film 181 may also be slower than the removal rate of second film 182. To that end, first film 181 may be formed from material that is less porous, i.e., denser, than the material from which second film 182 is fabricated. Exemplary materials from which first film 181 may be fabricated are TEOS, SiON and SiN. As a result, first film 181 of the multi-film cap layer 18 may be provided with a higher dielectric constant than second film 182. This, however, is of no consequence to the overall dielectric constant of the resulting structure, because first film 181 is a sacrificial layer. To that end, it is intended that first film 181 is removed completely during planarization using standard techniques, such as chemical mechanical polishing (CMP) techniques. Although first film 181 may be formed with any suitable thickness, in the present example, first film 181 has a thickness in a range of 100 to 1,000 angstroms. With the foregoing configuration film stack 21 may be planarized so as to remove all of deposition layer 20 and first film 181 without damaging dielectric layer 12, even though the removal rate of material from deposition layer 20 varies over the area thereof. This is beneficial in many processes, including single and dual damascene processes.

Figure 3:
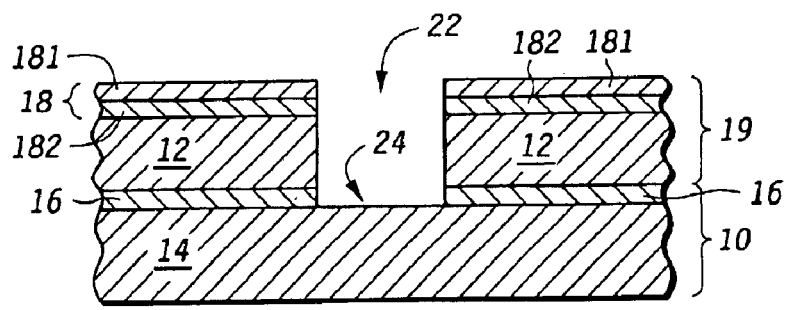
FIG. 3 is a cross-sectional view illustrating trench formation through both a film stack and passivation layer shown in FIG. 2 in accordance with the present invention.
Figure 4:
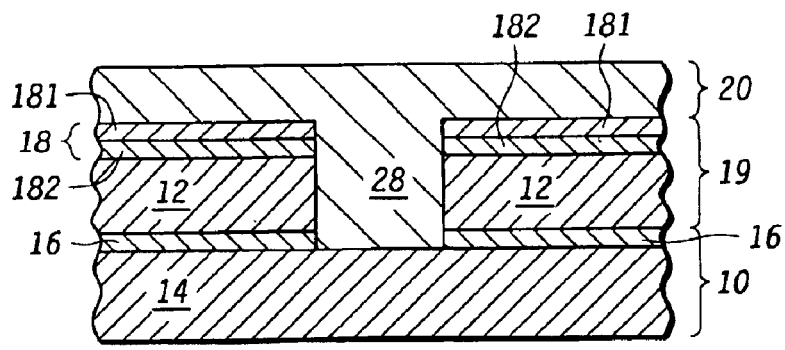
FIG. 4 is a cross-sectional view illustrating formation of a conductive film in the trench shown in FIG. 3.

For example, referring to FIGS. 3 and 4, a conductive contact is formed by creating a trench 22 through film stack 19 and passivation layer 16, exposing a region 24 of wafer 14. Trench 22 may be formed using any known etching process in the art. After formation of trench 22, conductive material, such as aluminum, copper or the like is deposited, a portion of which fills trench 22 forming line 28, with the remaining portions forming deposition layer 20. The conductive material may be deposited using any known process, such as CVD, electroplating and the like.

Figure 5:
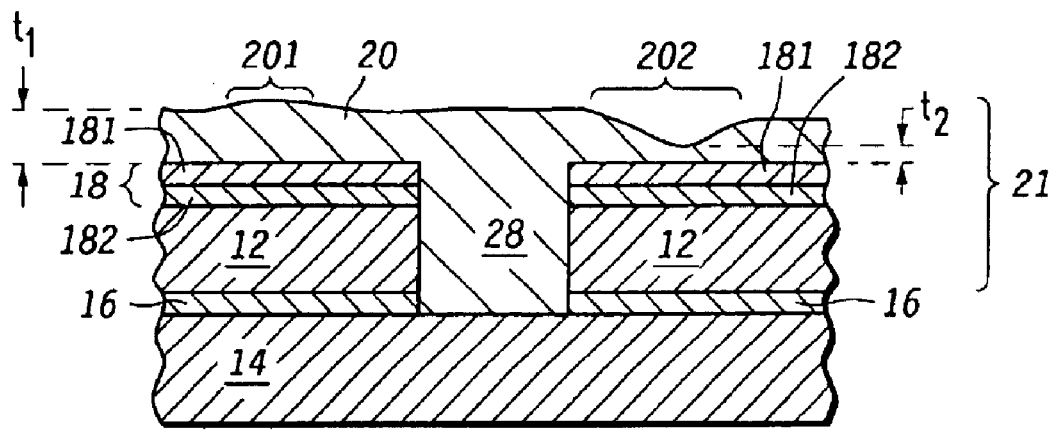
FIG. 5 is a cross-sectional view illustrating planarization of a conductive layer shown in FIG. 4 in accordance with the present invention.
Figure 6:
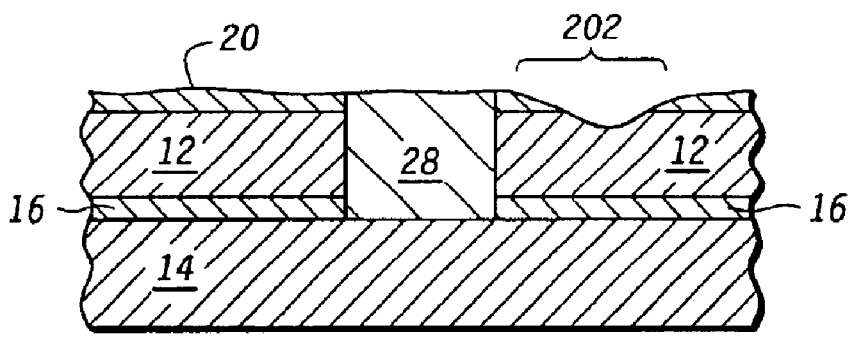
FIG. 6 is a cross-sectional view illustrating a planarization of the film stack shown in FIG. 5, without the multi-film cap layer being present.

Referring to FIGS. 4 and 5, deposition layer 20 is subjected to a CMP process to planarize line 28. The removal rate of deposition layer 20, however, is not uniform over an area thereof. This is shown by comparing regions 201 and 202. Region 201 has a thickness $t_1$ associated therewith that is greater than the thickness $t_2$ associated with region 202 and, therefore, the time required to remove the portion of deposition layer 20 proximate to region 202 is less than the time required to remove the portion of deposition layer 20 proximate to region 201. This variability of removal rate of deposition layer 20 over the area thereof would be problematic without the presence of multi-film cap layer 18. Specifically, as shown in FIG. 6, it is possible that during CMP, removal of portions of dielectric layer 12, in superimposition with region 202, may occur while regions of deposition layer 20 remain. This structurally degrades dielectric layer 12 and may increase the dielectric constant associated therewith through adsorption of the CMP slurry chemicals.

Figure 7:
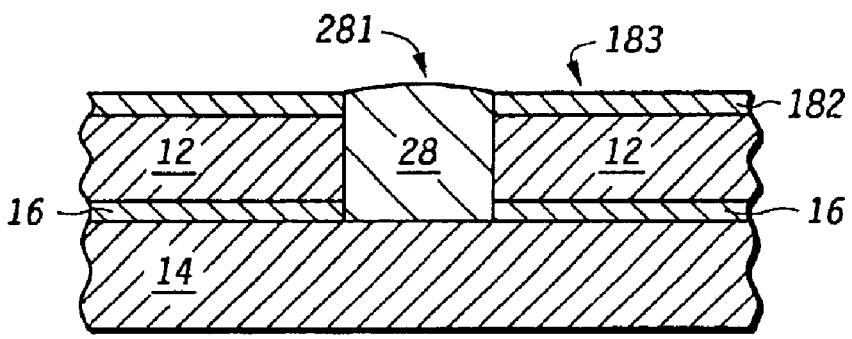
FIG. 7 is a cross-sectional view illustrating the benefits of providing the multi-film cap layer shown in FIG. 5.

Referring to FIGS. 5 and 7, multi-film cap layer 18 reduces, if not avoids, the problems presented by the variable removal rate of deposition layer 20 over an area thereof. Specifically, first film 181 retards the rate of removal during the CMP process, which compensates for the variable removal rate of deposition layer 20. As a result, once the CMP process reaches first film 181, the removal rate of film stack 21 is reduced in that region, allowing the remaining regions of deposition layer 20 to be removed from film stack 21 without damaging the underlying dielectric layer 12. To that end, the removal rate and thickness of first film 181 may be established so that removal of second film 182 does not occur until after the entire deposition layer 20 has been removed. Thereafter, the first film 181 is completely removed from film stack 21.

It is desired that the properties of second film 182 are established to facilitate second film 182 functioning as a cap layer for underlying dielectric layer 12, when subjected to the CMP process to remove first film 181. To that end, second film 182 would have removal rate and thickness properties sufficient to prevent underlying dielectric layer 12 from being structurally or electrically compromised during removal of first film 181. Thus, second film 182 would reduce, if not prevent, dielectric layer 12 from being removed or from absorbing CMP slurry chemicals during CMP processing. This would afford forming line 28 with a surface 281 that is substantially planar and contiguous with surface 183 of second film 182.

Alternatively, the combined properties of first and second films 181 and 182 may be arranged so that removal of second film 182 occurs before the entire deposition layer 20 is removed. However, the combined properties of first and second films 181 and 182, i.e., removal rate and thickness, are established to ensure that a sufficient quantity of second film 182 remains to function as a cap layer for underlying dielectric layer 12. As before, to properly function as a cap layer, it is desired that second film 182 protect dielectric layer 12 from the CMP process and reduce, if not prevent, adsorption of CMP slurry chemicals therein when both deposition layer 20 and first film 181 are completely removed from film stack 21.

The embodiments of the present invention described above are exemplary. Many changes and modifications may be made to the disclosure recited above, while remaining within the scope of the invention. For example, other materials may be employed to form the aforementioned layers, in addition to those mentioned above, while still being within the scope of the present invention. Therefore, this invention is not limited to the particular forms illustrated above. Rather, the appended claims cover all modifications that do not depart from the spirit and scope of this invention.

What is claimed is:

1. A method of forming a low-k dielectric structure on a substrate, said method comprising:

depositing, upon said substrate, a dielectric layer;

forming on said dielectric layer, a multi-film cap layer, said multi-film cap layer comprising first and second films, with said second film being disposed between said dielectric layer and said first film;

forming a deposition layer upon said multi-film cap layer, wherein said multi-film cap layer and said dielectric layer define a film stack; and removing portions of said film stack, said portions comprising said deposition layer wherein said multi-film cap layer has properties to prevent said dielectric layer from being removed upon removal of said deposition film;

wherein removing further comprises removing substantially all of said first film.

2. The method as recited in claim 1 wherein removing portions further comprises providing said first film with properties to prevent said second film from being removed during removal of said deposition layer.

3. The method as recited in claim 1 wherein forming on said dielectric layer further comprises providing said first film with a dielectric constant greater than a dielectric constant associated with said second film.

4. The method as recited in claim 1 wherein said properties comprise removal rate and film thickness.

5. The method as recited in claim 1 wherein forming on said dielectric layer further comprises forming said first film from materials selected from a set consisting essentially of TEOS, SiON and SiN and forming said deposition layer further comprises forming said deposition layer from a conductive material.

6. The method as recited in claim 1 wherein depositing further comprises depositing an OSG layer having a first porosity associated therewith and forming on said dielectric layer further comprises forming said second film from an additional OSG layer having a second porosity associated therewith, with said second porosity being less than said first porosity.

7. The method as recited in claim 1 wherein removing said portions comprises planarizing said film stack employing a chemical mechanical polishing technique and providing said first film and said second film with a removal rate, with the removal rate of said first film being substantially less than a removal rate of said deposition layer.

8. The method as recited in claim 1 further comprising forming a trench into said dielectric layer extending therethrough, wherein forming said deposition layer further comprises depositing a conductive material onto said substrate, a first sub-portion of said conductive material filling said trench to form a conductive contact.

9. A method of forming a low-k dielectric structure upon a substrate, said method comprising:

depositing, upon said substrate, a dielectric layer having a first porosity associated therewith;

forming on said dielectric layer, a multi-film cap layer, said multi-film cap layer comprising a sacrificial film having a second porosity associated therewith and a second film having a third porosity associated therewith, with said first porosity being greater than said second and third porosities and said third porosity being greater than said second porosity, said second film being disposed between said dielectric layer and said sacrificial film;

forming a deposition layer upon said multi-film cap layer, with said deposition layer, said multi-film cap layer and said dielectric layer defining a film stack; and removing portions of said film stack including substantially all of said sacrificial film, with said second and third porosities and a thickness of said first and second films being established to allow removal of said deposition layer from said film stack without removing said dielectric layer.

10. The method as recited in claim 9 wherein forming on said dielectric layer comprises providing said sacrificial film with a dielectric constant greater than a dielectric constant associated with said second film.

11. The method as recited in claim 9 wherein said properties comprise removal rate and film thickness.

12. The method as recited in claim 11 wherein depositing comprises depositing an OSG layer; forming on said dielectric layer further comprises forming said sacrificial film from materials from a set consisting essentially of TEOS, SiON and SiN and forming said second film from an additional OSG layer; and forming said deposition layer comprises forming said deposition layer of copper.

13. The method as recited in claim 9 wherein removing said portions further comprises planarizing said film stack employing a chemical mechanical polishing technique providing said sacrificial film and said second film with a removal rate, with the removal rate of said sacrificial film being substantially less than a removal rate of said deposition layer.

14. The method as recited in claim 9 further comprising forming a trench into said dielectric layer, wherein forming said deposition layer further comprises depositing copper material onto said substrate, with a first sub-portion of said copper material filling said trench to form a contact.

15. A semiconductor fabrication method for forming a dielectric film stack, comprising:

depositing a low k dielectric layer;

forming a capping layer on the low k layer;

depositing a sacrificial layer on the capping layer;

forming a trench through the sacrificial layer, the capping layer, and the low k dielectric layer;

depositing a conductive layer on the sacrificial layer and in the trench; and removing portions of the conductive layer exterior to the trench, wherein said removing includes removing the sacrificial layer wherein a dielectric constant of the film stack is independent of a dielectric constant of the sacrificial layer.

16. The method of claim 15, further comprising prior to depositing the low k dielectric, depositing a silicon nitride passivation layer and further wherein depositing the low k dielectric comprises depositing the low k dielectric on the passivation layer.

17. The method of claim 16, wherein the sacrificial layer is a TEOS layer.

18. The method of claim 17, wherein depositing the low k dielectric comprises depositing an organosilicate glass (OSG) and further wherein depositing the capping layer comprises depositing a second OSG layer and subsequently densifying the second OSG layer.

19. The method of claim 18, wherein depositing the conductive layer comprises depositing copper and wherein removing portions of the conductive layer comprises chemical mechanical polishing the conductive layer.

* * * * *